US009894759B2

(12) United States Patent
Rock et al.

(10) Patent No.: US 9,894,759 B2
(45) Date of Patent: Feb. 13, 2018

(54) SHAPED SUBSTRATE WITH ARRANGEMENT OF SOLID STATE LIGHT SOURCES

(71) Applicants: Ty Rock, Hallandale, FL (US); Biju Antony, Lynnfield, MA (US); Chaim Becerra, Danvers, MA (US); Bruce Radl, Stow, MA (US)

(72) Inventors: Ty Rock, Hallandale, FL (US); Biju Antony, Lynnfield, MA (US); Chaim Becerra, Danvers, MA (US); Bruce Radl, Stow, MA (US)

( * ) Notice: Subject to any disclaimer, the term of this patent is extended or adjusted under 35 U.S.C. 154(b) by 0 days.

(21) Appl. No.: 15/255,058

(22) Filed: Sep. 1, 2016

(65) Prior Publication Data
US 2017/0064820 A1 Mar. 2, 2017

Related U.S. Application Data

(60) Provisional application No. 62/213,379, filed on Sep. 2, 2015.

(51) Int. Cl.
| F21S 4/00 | (2016.01) |
| F21V 21/00 | (2006.01) |
| H05K 1/02 | (2006.01) |
| H05K 1/00 | (2006.01) |
| F21V 19/00 | (2006.01) |
| H05K 1/18 | (2006.01) |
| H05K 3/00 | (2006.01) |
| H05K 3/30 | (2006.01) |
| F21Y 105/10 | (2016.01) |

(Continued)

(52) U.S. Cl.
CPC ....... *H05K 1/0284* (2013.01); *F21V 19/0015* (2013.01); *H05K 1/00* (2013.01); *H05K 1/181* (2013.01); *H05K 3/0044* (2013.01); *H05K 3/303* (2013.01); *F21Y 2103/10* (2016.08); *F21Y 2105/10* (2016.08); *F21Y 2115/10* (2016.08); *H05K 2201/10106* (2013.01); *H05K 2203/0228* (2013.01)

(58) Field of Classification Search
CPC .... H05K 1/0284; H05K 1/181; H05K 3/0044; H05K 3/303; H05K 1/00; H05K 2201/10106; H05K 2203/0228; H05K 1/119; H05K 3/0026; F21V 19/0015; F21Y 2103/10; F21Y 2105/10; F21Y 2115/10
See application file for complete search history.

(56) References Cited

U.S. PATENT DOCUMENTS

2012/0320595 A1* 12/2012 Enke ................. H05B 33/0803
362/249.06
2013/0021811 A1* 1/2013 Goldwater ................ F21S 4/22
362/473

(Continued)

*Primary Examiner* — Donald Raleigh
(74) *Attorney, Agent, or Firm* — Shaun P. Montana

(57) ABSTRACT

A substrate for a solid state lighting module has a plurality of serrated finger sections extending from an interconnecting base. The substrate may be formed from a single rectangular sheet by cutting away material between adjacent finger sections of a symmetrical second substrate to form the finger sections of the substrate. Parallel linear rows of solid state light sources may be disposed along the length of each finger section. For example, the solid state light sources may be disposed proximate to points of sawteeth at the edges of the finger sections.

20 Claims, 4 Drawing Sheets

(51) Int. Cl.
*F21Y 115/10* (2016.01)
*F21Y 103/10* (2016.01)

(56) References Cited

U.S. PATENT DOCUMENTS

2015/0049497 A1* 2/2015 Wang .................. F21K 9/00
362/382
2017/0184262 A1* 6/2017 Ma ..................... F21S 4/20

* cited by examiner

SHAPED SUBSTRATE WITH ARRANGEMENT OF SOLID STATE LIGHT SOURCES

CROSS-REFERENCE TO RELATED APPLICATION

The present application claims the benefit of, and priority to, U.S. Provisional Patent Application No. 62/213,379, filed Sep. 2, 2015, the entire contents of which are hereby incorporated by reference.

TECHNICAL FIELD

The present invention relates generally to lighting, and more specifically, to substrates including solid state light sources.

BACKGROUND

Solid state lighting is being developed as a more energy-efficient and durable alternative to conventional lighting technologies such as incandescent and fluorescent. A solid state lighting device may include solid state light sources such as LEDs (light emitting diodes) that are mounted on a substrate such as a PCB (printed circuit board). The physical shape of the substrate used in solid state lighting devices is often designed such that the solid state lighting device can be used in place of a conventional lighting device. For example, some solid state lighting substrates have a so-called "bar" shape with a plurality of solid state lighting components arranged linearly thereon, resulting in a solid state lighting device that can be mounted in a tube and used to replace a single fluorescent tube light. Some other solid state lighting substrates have a planar quadrilateral shape such as a rectangle or a square, and occupy a large area.

SUMMARY

Lighting devices incorporating solid state light (SSL) sources can be designed to occupy a physical space that is similar to that occupied by the conventional lighting sources that the SSL-based lighting devices replace. For example, a light module with a bar-shaped substrate may fit into a lighting device designed for a conventional tubular fluorescent lamp. Similarly, a light module with a rectangular-shaped substrate may fit into a space similar to that used by, for example and without limitation, multiple tubular fluorescent lamps, e.g. in a 2×2 fixture, or two u-shaped fluorescent lamps. Such rectangular-shaped substrates including solid state light sources are simple to manufacture. However, a large amount of the surface area of the rectangular-shaped substrate material is unoccupied by electrical components such as solid state light sources. The sparsity of components may be increasing as a result of the increasing efficiency of solid state light sources and the practice of locating the electronic components that enable the solid state light sources to operate from typical mainline power or other AC power sources on a separate device, rather than on the substrate.

Some characteristics that may be desirable in a planar light module including solid state light sources, but which are not necessarily required in any implementation of the inventive concepts disclosed herein, include relatively uniform density of luminosity across the lighting surface as perceived by the human eye through a diffuser and efficient use of substrate materials. A desired surface luminosity density may be achieved by the uniform or regular dispersion of the light sources on the surface of the substrate. For example, the light sources may be arranged in a regular pattern in which the distance between adjacent sources facilitates uniformity of surface luminosity density through a diffuser while also achieving a desired aggregate luminosity over the surface of the planar light module. It should be noted however that adjacent sources need not necessarily all be equidistant in order to achieve acceptable uniformity of surface luminosity density. With regard to the substrate material, efficient use may correlate with reducing the amount of waste material resulting from manufacturing. With regard to the process, efficient use may correlate to reducing the distance and time needed to perform routing to separate the two symmetrical substrates.

In an embodiment, there is provided an apparatus. The apparatus includes: a solid state lighting module comprising a substrate comprising a plurality of finger sections extending from an interconnecting base, each finger section having a constantly varying width along a length thereof.

In a related embodiment, the substrate may be formed from a single rectangular sheet by cutting away material between adjacent finger sections of a symmetrical second substrate to form the finger sections of the substrate. In another related embodiment, the apparatus may include first and second linear rows of solid state light sources disposed along the length of each finger section. In a further related embodiment, the first and second linear rows may be symmetrical with respect to a centerline of each finger section. In a further related embodiment, the width of each finger section may vary linearly between a maximum value and a minimum value to form sawteeth. In a further related embodiment, the solid state light sources may be disposed proximate to points of the sawteeth. In a further related embodiment, the solid state light sources may be dispersed in a regular pattern. In a further related embodiment, the regular pattern may include perpendicular columns and rows, and adjacent solid state light sources in the rows may be equidistant, and adjacent solid state light sources in the columns may be equidistant.

In another embodiment, there is provided a method of forming a solid state lighting module. The method includes: forming, from a rectangular sheet of substrate material, a substrate comprising a plurality of finger sections extending from an interconnecting base, each finger section having a constantly varying width along a length thereof; and mounting solid state light sources on the substrate.

In a related embodiment, forming the substrate may include cutting away material between adjacent finger sections of a symmetrical second substrate to form the finger sections of the substrate. In another related embodiment, mounting the solid state light sources on the substrate may include disposing first and second linear rows of solid state light sources along the length of each finger section. In a further related embodiment, disposing may include disposing the first and second linear rows of solid state light sources symmetrically with respect to a centerline of each finger section. In a further related embodiment, forming the substrate may include forming sawteeth by linearly varying the width of each finger section between a maximum value and a minimum value. In a further related embodiment, mounting the solid state light sources on the substrate may include locating the solid state light sources proximate to points of the sawteeth. In a further related embodiment, mounting the solid state light sources on the substrate may include disbursing the solid state light sources in a regular pattern. In a further related embodiment, disbursing the solid state light sources in a regular pattern may include forming perpendicular columns and rows, wherein adjacent solid state light sources in the rows are equidistant, and wherein adjacent solid state light sources in the columns are equidistant.

In another embodiment, there is provided an apparatus. The apparatus includes: a substrate material cut into a first solid state lighting substrate and a second solid state lighting substrate, wherein the first and second solid state lighting substrates are symmetrical and each comprise a plurality of finger sections extending from an interconnecting base, each finger section having a constantly varying width along a length thereof.

In a related embodiment, the apparatus may include first and second linear rows of solid state light sources disposed along the length of each finger section. In a further related embodiment, the width of each finger section may vary linearly between a maximum value and a minimum value to form sawteeth.

In another related embodiment, the solid state light sources may be disposed proximate to points of the sawteeth.

BRIEF DESCRIPTION OF THE DRAWINGS

The foregoing and other objects, features and advantages disclosed herein will be apparent from the following description of particular embodiments disclosed herein, as illustrated in the accompanying drawings in which like reference characters refer to the same parts throughout the different views. The drawings are not necessarily to scale, emphasis instead being placed upon illustrating the principles disclosed herein.

DETAILED DESCRIPTION

Any of the substrates including solid state light sources described herein may also be referred to, without limitation, as light engines or light modules. Such embodiments may, and some embodiments do, include other electrical components in addition to the solid state light sources, including resistors, capacitors, inductors, microcontrollers, transformers, wire connectors, and so on, without limitation. A light engine or light module may be part of a lighting device.

Figure 1:
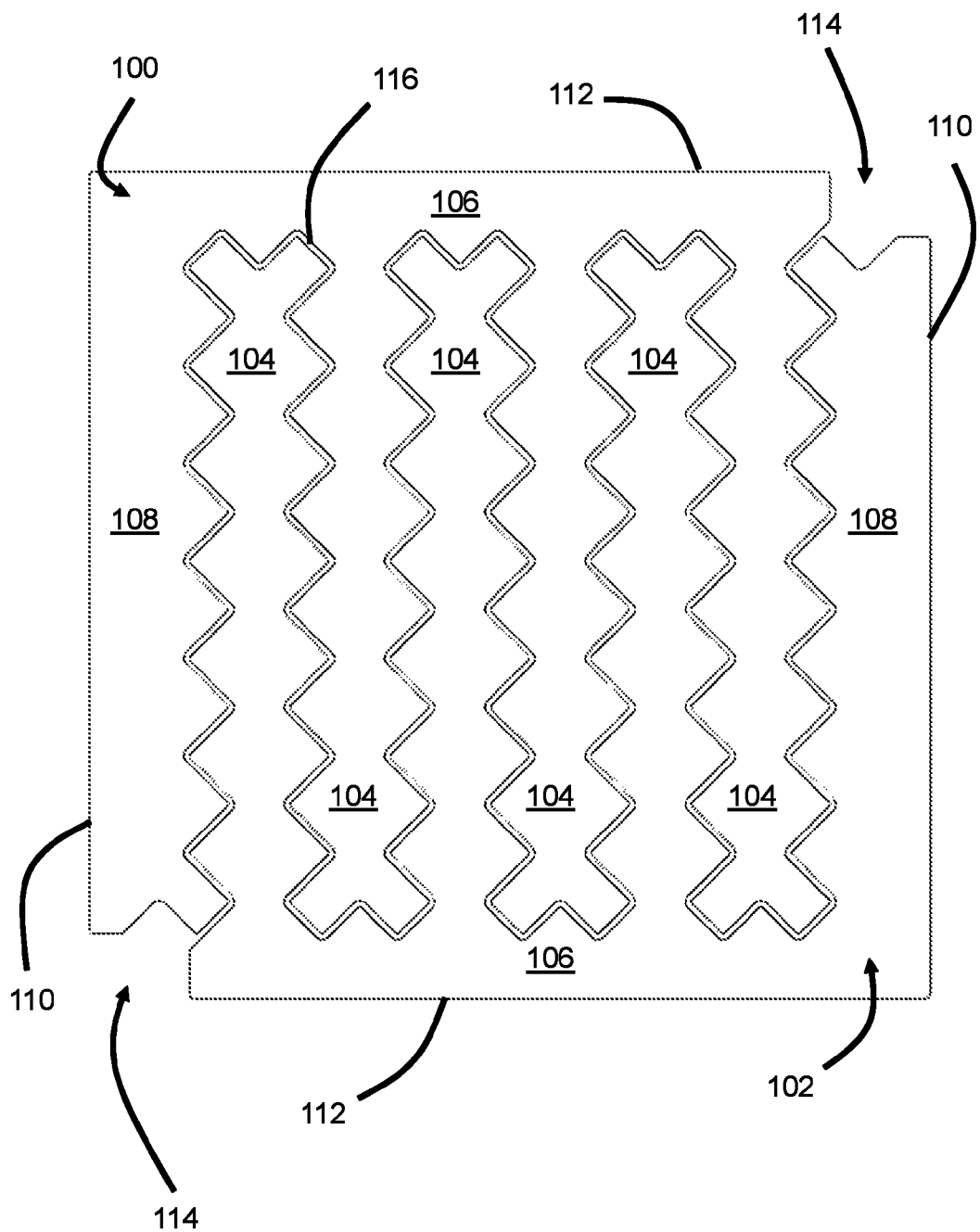
FIG. 1 illustrates a planar rectangular substrate material processed to provide two symmetrical solid state lighting substrates, according to embodiments disclosed herein.

Referring now to FIG. 1, an efficient substrate for use with a planar light module may be produced by forming two or more symmetrical SSL substrates 100, 102 from a single planar rectangular sheet of substrate material. Each of the resulting SSL substrates 100, 102 may include parallel finger sections 104 that extend from an interconnecting base section 106, e.g. perpendicular thereto. The substrate material between adjacent finger sections of SSL substrate 100 is cutaway to form the finger sections of SSL substrate 102, and vice versa. An outermost finger section 108 may include an outer linear edge 110 of the rectangular sheet of substrate material. The interconnecting base section 106 may also include an outer linear edge 112 of the rectangular sheet of substrate material. In other words, each of the resulting SSL substrates 100, 102 incorporates two of the four linear edges of the sheet of substrate material. Opposing corners 114 of the sheet of substrate material may be, but are not necessarily, cut away. For example, the corners 114 could be used to mount the SSL substrate in a lighting fixture and then be broken away. In the illustrated example a single kerf 116 shows how the single sheet of substrate material is cut into two symmetrical SSL substrates 100, 102 with a single cut. However, a perforated kerf could be implemented, and the corners 114 may be separately cut. The kerf 116 may be cut with a laser, router, saw or other manufacturing tool.

Figure 2:
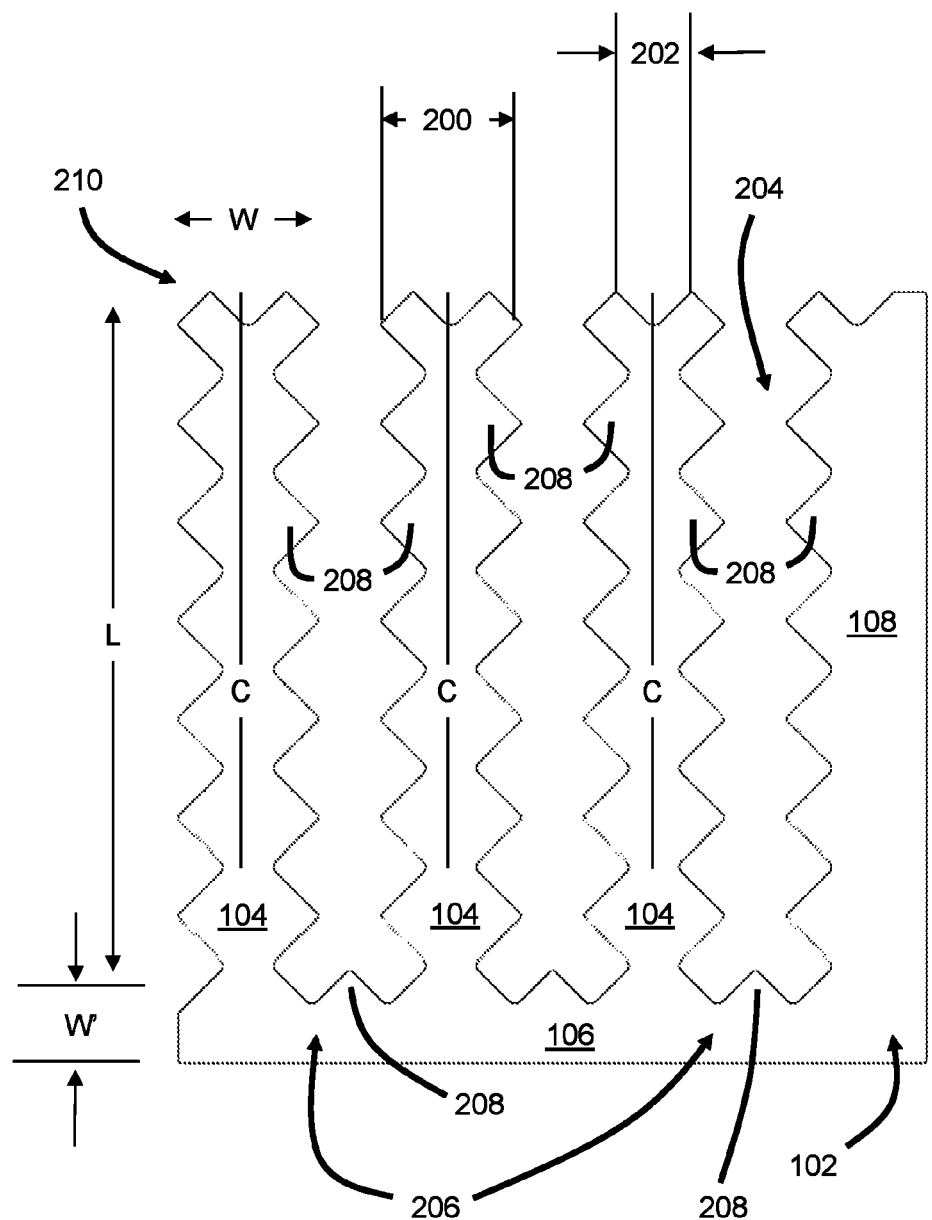
FIG. 2 illustrates one of the solid state lighting substrates shown in FIG. 1, according to embodiments disclosed herein.

FIG. 2 illustrates SSL substrate 102 of FIG. 1, although the described features may be present on both SSL substrates. The finger sections 104, other than the outermost finger section 108, may have a constantly varying width dimension W along a length dimension L. Moreover, the finger sections 104 may each be symmetrical with respect to a center line C along the length dimension L. The constantly varying width dimension W may alternate between a greatest width value 200 and a least width value 202. For example, the width value W may vary linearly, thereby producing the serrated edge profile depicted in the illustrated example. However, the width W of the finger sections 104 may vary non-linearly, e.g. to produce a curved, sinusoidal or other edge profile. The edge profile may also be implemented along an inner edge 204 of the outermost finger section 108 and along an inner edge 206 of the interconnecting base 106. In other words, a width W' of the interconnecting base 106 may vary between finger sections 104 projecting therefrom linearly or otherwise, e.g. to provide corresponding sawteeth 208 having the same dimensions as the sawteeth 208 of the finger sections. As a result, a distal end 210 of each finger section 104 opposite the interconnecting base 106 may have an edge profile that mirrors the inner edge 206 of the interconnecting base, e.g., the inverse of the serrated edge profile.

Figure 3:
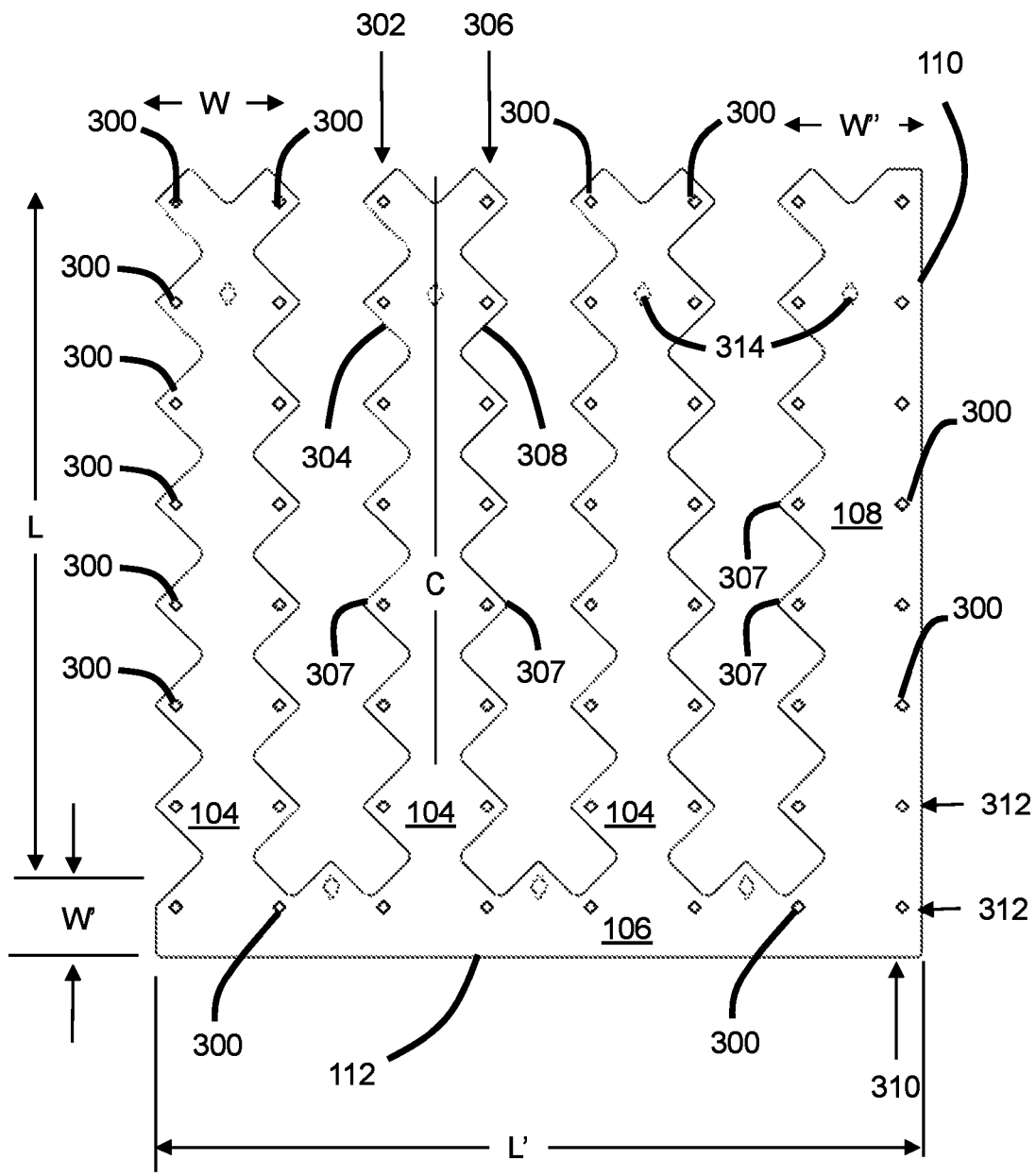
FIG. 3 illustrates the solid state lighting substrate of FIG. 2 with solid state light sources mounted thereon, according to embodiments disclosed herein.

Referring now to FIG. 3, SSL sources 300 may be positioned on the finger sections 104 proximate to the edges thereof. For example, the SSL sources 300 may be disposed in a first linear column 302 along a first edge 304 and in a second linear column 306 along a second edge 308. The first and second linear columns 302, 306 of SSL sources on each finger section may be parallel and symmetrical with respect to the center axis C. Moreover, the SSL sources 300 in each column may be located along the length dimension L at positions corresponding to the greatest width W of the finger section 104 on which they are disposed, e.g., proximate to the points 307 of the sawteeth. Adjacent SSL sources may be equidistant along axes that are parallel with the linear edges 110, 112 (vertical columns 302, 304 and horizontal rows 312 in the drawing). Adjacent SSL sources 300 along axes that are non-parallel with the linear edges 110, 112 (e.g., diagonally adjacent SSL sources) may also be equidistant, but the distance between adjacent SSL sources along axes that are non-parallel with the linear edges is not necessarily the same as the distance between adjacent SSL sources along axes that are parallel with the linear edges. As a result, a regular pattern, array or grid may be defined in which co-linear SSL sources define regularly spaced perpendicular rows 312 and columns 302, 306, although this should not be viewed as a limitation.

The regular pattern, array or grid of SSL sources 300, the locations of which correspond to the constantly varying width W of the finger sections 104 other than the outermost finger section 108, may be extended onto the interconnecting base 106 and the outermost finger section 108. On the outermost finger section the placement of the SSL sources 300 along the length dimension L may correspond to positions of greatest width W" of the outermost finger section, e.g. at the point 307 of each sawtooth. An outermost column 310 of SSL sources 300 may, but need not necessarily, be positioned proximate to the linear edge 110 in accordance with the regular distribution pattern of SSL sources. On the interconnecting base 106 the placement of the SSL sources 300 along a length dimension L' may correspond to positions of least width W' of the interconnecting base 106 in accordance with the regular distribution pattern of SSL sources.

Mounting keyholes 314 may be formed through the SSL substrate. The mounting keyholes may be oval or diamond-shaped, although this should not be viewed as limiting. In general, an elongated mounting keyhole opening will accommodate a thin metal key of a lighting fixture onto which the SSL substrate is mounted, e.g. by twisting the thin metal key after insertion through the mounting keyhole.

Figure 4:
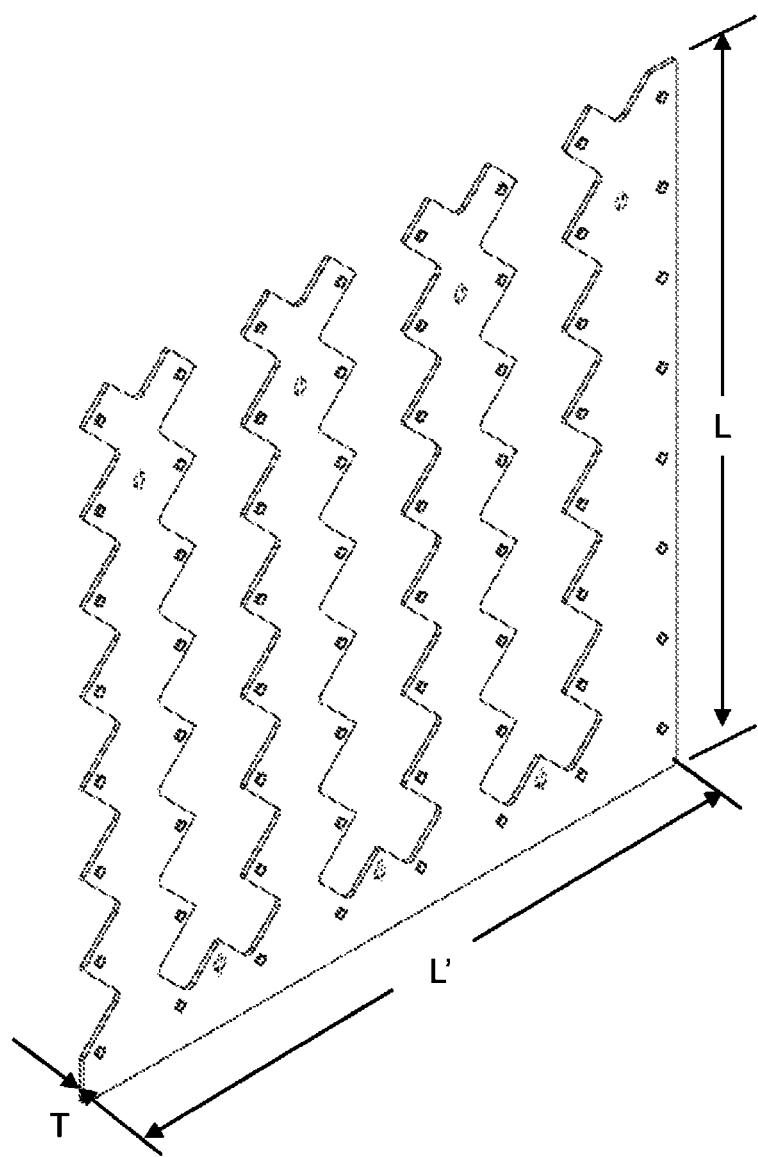
FIG. 4 is a perspective view of the solid state lighting substrate of FIG. 3, according to embodiments disclosed herein.

The perspective view shown in FIG. 4 is one example of a ratio of SSL substrate thickness T to the length dimensions L and L'. However, this is shown for context purposes only and should not be viewed as limiting. Moreover, the sheet of substrate material need not necessarily be rectangular prior to being processed. For example and without limitation, a flexible feedstock sheet in a roll could be cut into a number alternating symmetrical SSL substrates as a function of the length of the roll.

Referring now to FIGS. 1 and 3 it will be appreciated that the sawtooth edge profile of the finger sections 104, outermost finger section 108 and interconnecting base 106 allows the SSL sources 300 to be disbursed in a regular pattern in which adjacent SSL sources are equidistant along the length dimensions L and L'. More particularly, both SSL substrates 100, 102 accommodate the same regular pattern of SSL sources, thereby providing uniform density of luminosity as perceived by the human eye if a diffuser is used. Further, the sawtooth edge profile pattern presents the shortest cut length for manufacturing symmetrical SSL substrates that accommodate the SSL sources in the regular pattern because the sawtooth points are proximate to the SSL sources and a straight line is the shortest distance between two points. The sawtooth pattern may also present fewer corners than some other designs. Reducing or minimizing cut length and number of corners may improve manufacturability by reducing cutting time and router wear.

In view of the description above it should be understood that one possible improvement to the typical large quadrilateral shaped SSL substrate is to instead make a so-called finger-shaped substrate. A finger shaped substrate, in its simplest form, may resemble a straight capital U, or a straight capital E, with SSL sources disposed on each "finger" that extends out from the interconnecting base. A finger-shaped substrate may have any number of fingers greater than one. Such a finger shaped substrate may occupy the same overall footprint as a large quadrilateral shaped substrate, with the same number of SSL sources, but require less substrate material to manufacture.

The SSL sources 300 may be arranged in a linear fashion on each finger 104. Some finger-shaped substrates include corresponding pairs of a plurality of posts, extending out from all but one of the sidemost fingers. In other words, between each SSL source on one side of the finger, a portion of the substrate is removed. Such a refined finger-shaped substrate occupies substantially the same overall footprint as a typical quadrilateral-shaped substrate, but uses less substrate material.

Embodiments may further improve on such finger-shaped substrates by shaping at least one side of each finger to have a plurality of triangular indentations. The overall effect is that at least one side of each finger has a sawtooth shape to it. In other words, at least one side of each finger looks like a plurality of sawteeth. In some embodiments, at least one finger has a sawtooth shape on each side. In some embodiments, all of the fingers have a sawtooth shape on each side. In some embodiments, all of the fingers except one have a sawtooth shape on each side; the one remaining finger has a sawtooth shape on only one side. In some such embodiments, the one remaining finger is a first or last finger. Alternatively, in some embodiments, the one remaining finger is another one of the fingers. In some embodiments, all of the fingers except two have a sawtooth shape on each side; the two remaining fingers have a sawtooth shape on only one side. In some such embodiments, the two remaining fingers are the first and last finger. Alternatively, in some embodiments, one of the two remaining fingers is one of the first and last finger, and the other of the two remaining fingers is another one of the fingers. Alternatively, in some embodiments, the two remaining fingers are any of the fingers except the first and last fingers. In some embodiments, at least one of the fingers has a triangular indentation at the top. In some embodiments, at least one of the fingers has no indentation at the top. In some embodiments, all of the fingers have a triangular indentation at the top. In some embodiments, none of the fingers has an indentation at the top.

In some embodiments, at least one triangular indentation has a sharp point at the vertex of the triangle. In some embodiments, all triangular indentations have a sharp point at the vertex of the triangle. In some embodiments, at least one triangular indentation has a rounded tip at the vertex of the triangle. In some embodiments, all triangular indentations have a rounded tip at the vertex of the triangle. In some embodiments, combinations of rounded tips and sharp points are used.

The base of the sawtooth finger-shaped substrate is that portion of the substrate from which the sawtooth fingers extend. In some embodiments, at least one triangular indentation, with either a rounded tip or a sharp point at the vertex of the triangle or combinations thereof, is made in the base between at least two fingers. In some embodiments, two triangular indentations, and in some embodiments more than two triangular indentations, having either a rounded tip or a sharp point at the vertex of the triangle or combinations thereof, is made in the base between at least two fingers. In some embodiments, a half-triangular indentation is made in the base next to the outermost finger on one side of the substrate.

In some embodiments, a single substrate is cut into two corresponding sawtooth finger shaped substrates that fit inside, or nest within, each other. At least one corner, and in some embodiments two corners, of the single substrate are removed during the cutting process. This significantly reduces the amount of unused waste material.

Though substrates are shown as having four fingers, of course embodiments are not so limited and may have any number of fingers. Further, though embodiments are shown as having at least one finger that has a sawtooth shape on only one side of the finger, embodiments are not so limited and in some embodiments, multiple fingers may have a sawtooth shape on only one side of those multiple fingers.

The sawtooth shaped finger substrate, when populated with solid state light sources, may provide for a much higher density of solid state light sources than a typical finger shaped substrate. This is because each sawtooth shape in each finger is able to have one or more solid state light sources placed thereon. In a typical finger board, only a single linear array of solid state light sources is typically placed on a single finger. Though a refined finger-shaped substrate with posts, as described above, also allows for multiple arrays of solid state light sources on a single finger, such substrates leave the solid state light sources oriented in the same direction as they would be on a typical large quadrilateral-shaped substrate. That is, a line in the same direction as the fingers symmetrically vertically bisects all of the solid state light sources in a column array along a finger, and a line perpendicular to the direction of the fingers symmetrically horizontally bisects all of the solid state light sources in row array across the fingers. Embodiments here are not so limited, and thus the solid state light sources are oriented on the sawteeth such that a corner of a solid state light source faces a tip (sharp or rounded) of a sawtooth. Thus, a line that is perpendicular to the direction of the fingers does not bisect the solid state light sources, and a line that is parallel to the direction of the fingers does not bisect the solid state light sources.

In some embodiments, only some of the solid state light sources are offset oriented. In some embodiments, some of the solid state light sources which are not located on sawteeth (for example, on a finger on which only one side of the finger has a sawtooth shape), are nonetheless still offset oriented. In some embodiments, the base of the sawtooth finger shaped substrate has a row of solid state light sources that are linearly arranged and not offset oriented. In some embodiments, the base of the sawtooth finger shaped substrate has a row of solid state light sources, where some of the solid state light sources are not offset oriented and some of the solid state light sources (for example, the first and last solid state light sources in the row) are offset oriented. In some embodiments, when two sawtooth finger shaped substrates are nested inside each other, the solid state light sources on corresponding ones of the fingers form an array of solid state light sources in which all of the solid state light sources sit centered on a straight line. In some embodiments, the solid state light sources are all intersected by the same straight line but are not all centered on that line. In some such embodiments, at least some of the solid state light sources on at least one set of sawteeth on at least one finger are spaced back from the tips of the respective sawteeth on which they are located so as to form an array of solid state light sources with the corresponding solid state light sources of the corresponding finger(s) where the array centered on a straight line. In some such embodiments, not all of the solid state light sources on the fingers are part of the array.

In some embodiments, the sawtooth shape is applied to one or more sides of a typical bar shaped substrate. In some such embodiments, the solid state light sources are offset oriented on one or more of the sawteeth, in any of the configurations described above. These offer the same advantages as described above, in a smaller footprint than a finger shaped substrate.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems.

Throughout the entirety of the present disclosure, use of the articles "a" and/or "an" and/or "the" to modify a noun may be understood to be used for convenience and to include one, or more than one, of the modified noun, unless otherwise specifically stated. The terms "comprising", "including" and "having" are intended to be inclusive and mean that there may be additional elements other than the listed elements.

Elements, components, modules, and/or parts thereof that are described and/or otherwise portrayed through the FIGS. to communicate with, be associated with, and/or be based on, something else, may be understood to so communicate, be associated with, and or be based on in a direct and/or indirect manner, unless otherwise stipulated herein.

Although the methods and systems have been described relative to a specific embodiment thereof, they are not so limited. Obviously many modifications and variations may become apparent in light of the above teachings. Many additional changes in the details, materials, and arrangement of parts, herein described and illustrated, may be made by those skilled in the art.

What is claimed is:

1. An apparatus comprising:
   a solid state lighting module comprising a substrate comprising a plurality of finger sections extending from an interconnecting base, each finger section having a constantly varying width along a length thereof.

2. The apparatus of claim 1, wherein the substrate is formed from a single rectangular sheet by cutting away material between adjacent finger sections of a symmetrical second substrate to form the finger sections of the substrate.

3. The apparatus of claim 1, comprising first and second linear rows of solid state light sources disposed along the length of each finger section.

4. The apparatus of claim 3, wherein the first and second linear rows are symmetrical with respect to a centerline of each finger section.

5. The apparatus of claim 4, wherein the width of each finger section varies linearly between a maximum value and a minimum value to form sawteeth.

6. The apparatus of claim 5, wherein the solid state light sources are disposed proximate to points of the sawteeth.

7. The apparatus of claim 6, wherein the solid state light sources are dispersed in a regular pattern.

8. The apparatus of claim 7, wherein the regular pattern comprises perpendicular columns and rows, and wherein adjacent solid state light sources in the rows are equidistant, and wherein adjacent solid state light sources in the columns are equidistant.

9. A method of forming a solid state lighting module, comprising:
   forming, from a rectangular sheet of substrate material, a substrate comprising a plurality of finger sections extending from an interconnecting base, each finger section having a constantly varying width along a length thereof; and
   mounting solid state light sources on the substrate.

10. The method of claim 9, wherein forming the substrate comprises cutting away material between adjacent finger sections of a symmetrical second substrate to form the finger sections of the substrate.

11. The method of claim 9, wherein mounting the solid state light sources on the substrate comprises disposing first and second linear rows of solid state light sources along the length of each finger section.

12. The method of claim 11, wherein disposing comprises disposing the first and second linear rows of solid state light sources symmetrically with respect to a centerline of each finger section.

13. The method of claim 12, wherein forming the substrate comprises forming sawteeth by linearly varying the width of each finger section between a maximum value and a minimum value.

14. The method of claim 13, wherein mounting the solid state light sources on the substrate comprises locating the solid state light sources proximate to points of the sawteeth.

15. The method of claim 14, wherein mounting the solid state light sources on the substrate comprises disbursing the solid state light sources in a regular pattern.

16. The method of claim 15, wherein disbursing the solid state light sources in a regular pattern comprises forming perpendicular columns and rows, wherein adjacent solid state light sources in the rows are equidistant, and wherein adjacent solid state light sources in the columns are equidistant.

17. An apparatus comprising:

a substrate material cut into a first solid state lighting substrate and a second solid state lighting substrate, wherein the first and second solid state lighting substrates are symmetrical and each comprise a plurality of finger sections extending from an interconnecting base, each finger section having a constantly varying width along a length thereof.

18. The apparatus of claim 17, comprising first and second linear rows of solid state light sources disposed along the length of each finger section.

19. The apparatus of claim 18, wherein the width of each finger section varies linearly between a maximum value and a minimum value to form sawteeth.

20. The apparatus of claim 17, wherein the solid state light sources are disposed proximate to points of the sawteeth.

* * * * *